United States Patent [19]

Chen et al.

[11] Patent Number: 5,754,080

[45] Date of Patent: May 19, 1998

[54] SINGLE-EDGE TRIGGERED PHASE DETECTOR

[75] Inventors: Dao-Long Chen; Robert D. Waldron, both of Fort Collins, Colo.

[73] Assignees: AT&T Global Information Solutions Company; Hyundai Electronics America; Symbios Logic, Inc.

[21] Appl. No.: 834,154

[22] Filed: Apr. 14, 1997

Related U.S. Application Data

[63] Continuation of Ser. No. 639,410, Apr. 29, 1996, abandoned, Continuation of Ser. No. 171,125, Dec. 20, 1993, abandoned.

[51] Int. Cl.[6] ........................................................ H03L 7/08
[52] U.S. Cl. ............................. 331/25; 331/1 A; 375/376; 327/12; 327/159
[58] Field of Search ..................................... 307/511, 514, 307/516, 517; 331/1 A, 25; 328/109, 110, 134; 360/51; 327/12, 159; 375/376

[56] References Cited

U.S. PATENT DOCUMENTS

| | | |
|---|---|---|
| 3,967,061 | 6/1976 | Dobias ................................. 375/361 |
| 4,754,225 | 6/1988 | Minuhin ............................... 328/133 |
| 4,857,866 | 8/1989 | Tateishi ................................ 331/1 A |
| 4,968,906 | 11/1990 | Pham et al. .......................... 327/291 |
| 4,970,475 | 11/1990 | Gillig .................................... 331/25 |
| 5,047,658 | 9/1991 | Shrock et al. ........................ 327/155 |
| 5,059,833 | 10/1991 | Fujii .................................... 3321/1 A X |
| 5,299,237 | 3/1994 | Head .................................... 331/1 R |

OTHER PUBLICATIONS

"Phase–Locked Loop Data Book," Motorola Inc. Second edition, Aug. 1973, p. 38.

*Primary Examiner*—Robert Pascal
*Assistant Examiner*—Arnold Kinkead
*Attorney, Agent, or Firm*—Wayne P. Bailey

[57] ABSTRACT

A single-edge triggered phase detector which provides high speed phase detection. The phase detector works on only a single edge of the clock and data signal, which can be either the rising or falling edge. Extracted control signals are latched for at least one half of a clock period or more to ensure full rail to rail swing.

36 Claims, 5 Drawing Sheets

SINGLE-EDGE TRIGGERED PHASE DETECTOR

This is a continuation of application Ser. No. 08/639,410 filed Apr. 29, 1996 which is a continuation of application Ser. No. 08/171,125 filed Dec. 20, 1993 both abandoned.

TECHNICAL FIELD

The present invention relates to the generation of control signals for use by electronic circuitry, and more particularly to the generation of control signals used to control a variable oscillator.

BACKGROUND OF THE INVENTION

In the detection or reception of optical electrical, or magnetic signals, it is often desirable to maintain a phase relationship between differing signals. The phase relationship can be critical to the successful transfer of information, where the phase of one signal with respect to some reference signal is used to convey information. Various phase modulation techniques, such as phase shift keying, or PSK, use the phase of a signal to convey information. Some signals may need to be maintained in phase with one another, whereas other signals may need to be maintained out of phase with one another. When signals are maintained in phase with one another, this is referred to as phase locked signals.

Phase detectors are used for fine adjustment between two phase locked signals. The fine adjustment is needed to ensure that the two signals remain locked in phase with one another. This is particular useful in many serial data communications systems, where a phase-locked loop is used to recover the embedded clock signal from the incoming data stream.

Current phase detectors generally operate properly when used in relatively slow speeds of operation, but become inoperable at higher speeds of operation. This is due to the fact that the control signals generated from the incoming data stream have very narrow pulse widths at high speed. The narrow pulse widths result in less than full rail swings (e.g. from 0 to +VDD volts; and from +VDD to 0 volts) for these extracted control signals.

Attempts to overcome the aforementioned problem have resulted in the use of costly types of technology to manufacture the circuitry. For example, integrated circuit technologies such as bipolar or gallium arsenide both operate at higher speeds than CMOS, and can partially mitigate the narrow pulse width problem. However, these technologies are more costly than CMOS, both as to manufacturing cost as well as power consumption requirements. There is a need for a high speed phase detection system that can use conventional, low cost integrated circuitry such as CMOS. There is also a need for such a detection system using other integrated circuit technologies, such as silicon bipolar or gallium arsenide, to further extend the maximum speeds of operation.

SUMMARY OF THE INVENTION

The present invention is a single-edge triggered phase detector which operates to provide high speed phase detection. The phase detector works on only a single edge of the clock and data signal, which can be either the rising or falling edge. Extracted control signals are latched for at least one half of a clock period or more to ensure full rail to rail swing. By using a single edge of the clock and data signals, as opposed to using both the rising and falling edges, higher bandwidth data signaling can be accommodated.

It is therefore an object of the present invention to provide an improved circuit for detecting clock signals.

It is yet another object of the present invention to provide an improved method of generating control signals.

It is still another object of the present invention to provide an improved method for controlling an oscillator.

It is yet another object of the present invention to provide an improved technique for maintaining phase locked signals.

It is another object of the present invention to use CMOS technology for the extraction of a clock signal from a high speed data signal.

These, and other, objects and advantages will now be further described in the detailed description of the preferred embodiment, with reference to the following drawing, in which:

DETAILED DESCRIPTION OF THE PREFERRED EMBODIMENT

Figure 1:
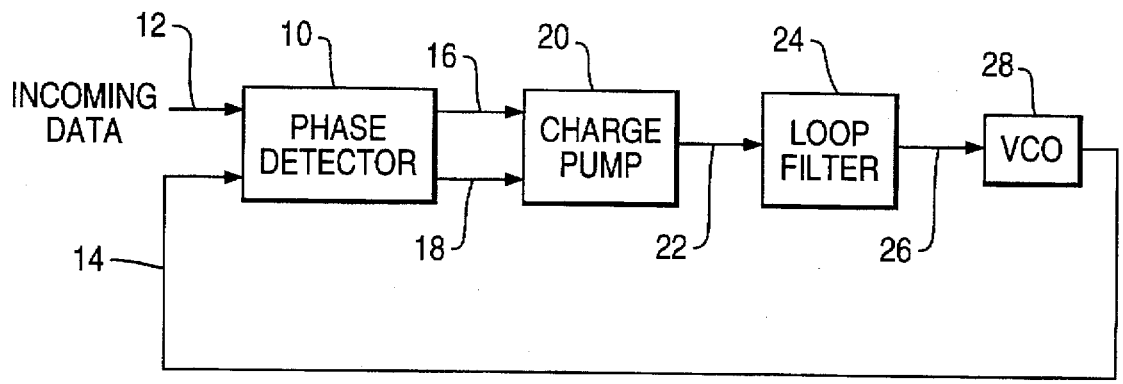
FIG. 1 shows a phase-looked loop block diagram.

In many serial data communications systems, a phase-locked loop (PLL) is needed to recover an embedded clock signal from the incoming data stream. FIG. 1 shows a block diagram of a traditional phase-locked loop known in the art. The phase detector 10 compares the phase difference between the incoming data 12 and the VCO (voltage-controlled oscillator) clock 14, and generates control signals 16 and 18 to correct the phase difference between the data and clock signals. The control signals 16 and 18 generated by the phase detector 10 are used by the charge pump 20 to modulate at 22 the amount of charge stored in the loop filter 24 (the UP and DOWN signals are used to adjust the charge/voltage at the loop filter either up or down). In turn, the output voltage 26 of the loop filter 24 adjusts the phase of the VCO 28 to minimize the phase difference between the incoming data 12 and the VCO clock 14.

Figure 2:
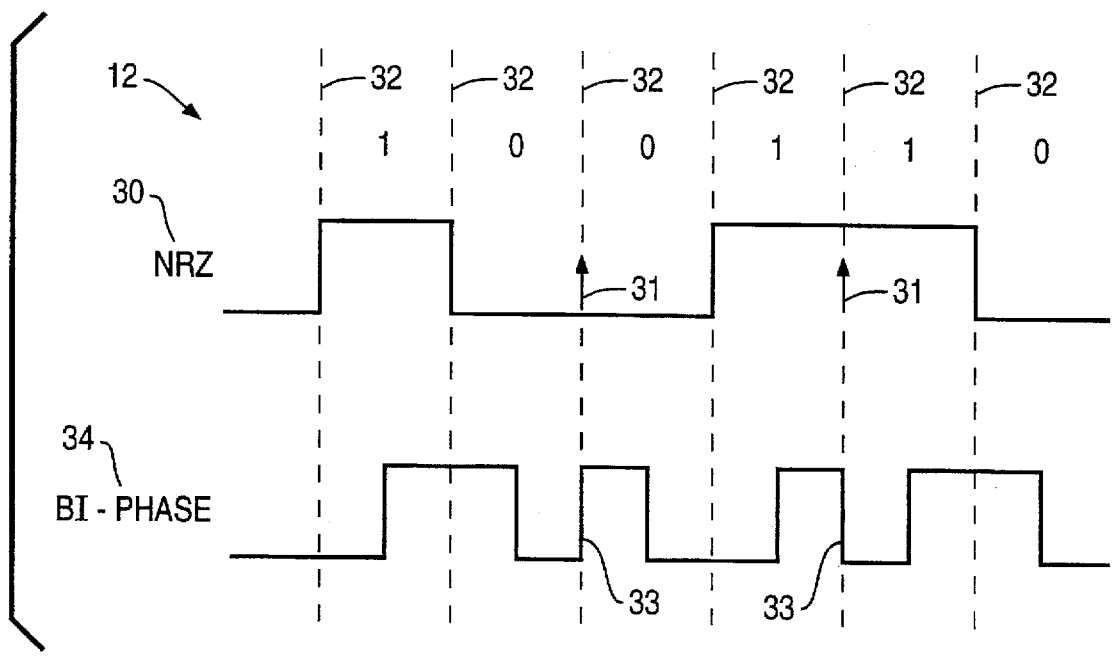
FIG. 2 shows various types of coding schemes used in serial data communication systems.

Depending on the coding scheme used, the incoming data 12 may have either extra edges at the bit cell boundary or have missing edges at the bit cell boundary. As shown in FIG. 2, if encoded in the NRZ (non-return-to-zero) format 30, there are missing edges 31 at some of the bit cell boundaries 32. On the other hand, if encoded in the bi-phase format 34, there are extra edges 33 at some of the bit cell boundaries 32. In order to handle the missing or extra edges and avoid locking to the harmonics or sub-harmonics of the incoming data rate frequency, the phase detector (10 of FIG. 1) must be initially triggered by the incoming data 12 instead of the VCO clock (14 of FIG. 1).

Figure 3:
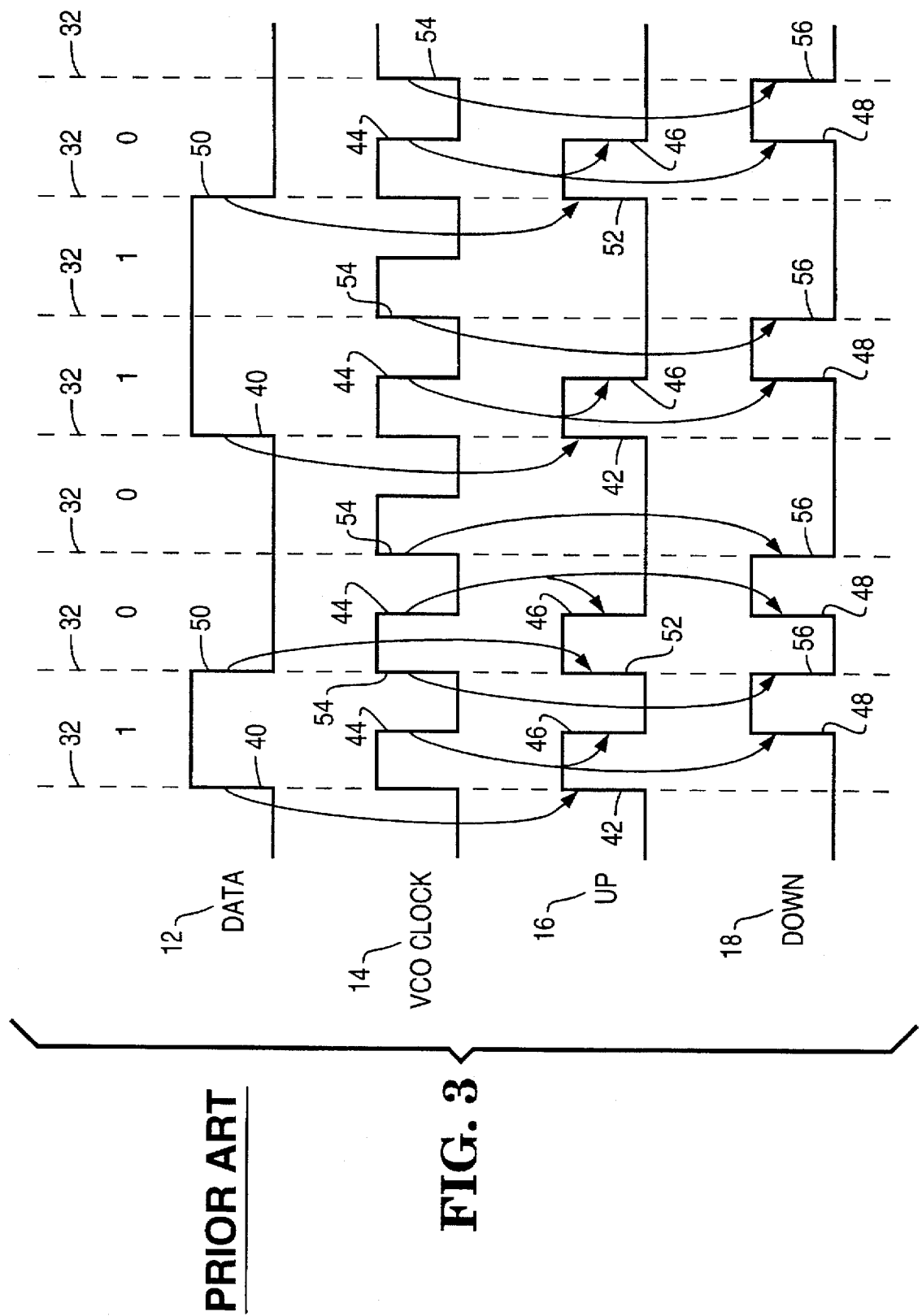
FIG. 3 shows a timing diagram of a traditional phase detector which uses both the rising and falling edges of the data and clock signals.

Traditionally, the phase detector is triggered by both edges (rising and falling) of the incoming data and VCO clock to maximize the loop gain of the PLL (maximizing loop gain makes the PLL more responsive to edge transitions). FIG. 3 shows the input and output waveforms of a conventional phase detector. The input wave forms are data 12 and VCO clock 14. The output wave forms are UP 16 and DOWN 18 control signals. The dual-edge triggering is as follows. The rising data signal at 40 causes the UP signal 16 to activate at 42. When the UP signal is active, the falling edge 44 of the VCO clock signal 14 causes the UP signal 16 to deactivate at 46, and further causes the DOWN signal 18 to activate at 48. When the incoming data stream goes to a logical zero, the falling edge 50 causes the UP signal 16 to activate at 52. When the DOWN signal is active, the rising edge 54 of the VCO clock signal 14 causes the DOWN signal to deactivate at 56.

As the data rate increases, the pulse width of the UP and DOWN control signals 16 and 18 becomes more narrow. At some point, the pulse width will become so narrow that the control signals 16 and 18 will never reach full rail. As a result, the designer must move to a faster technology, such as silicon bipolar or GaAs, to handle higher data rates.

The present invention is a new phase detector which allows the use of CMOS technology, or any other given technology, at high data rates. To accomplish this, only one edge of the data signal, rather than both edges, is used to initiate the operation of the phase detector. After the phase detector has been initiated, only one of the clock signal edges (rising or falling) is used to activate and deactivate the control signals. As a result, the DOWN pulse width signal can be increased to a full clock period, since it is no longer activated by the falling edge of the clock signal. In addition, the UP pulse width can be increased to a clock period plus/minus the phase difference, since it is no longer deactivated by the falling edge of the clock signal. This implementation can be run at very high speeds without the problem of the UP or DOWN pulse being too narrow, or failing to reach a full rail to rail transition.

Figure 4:
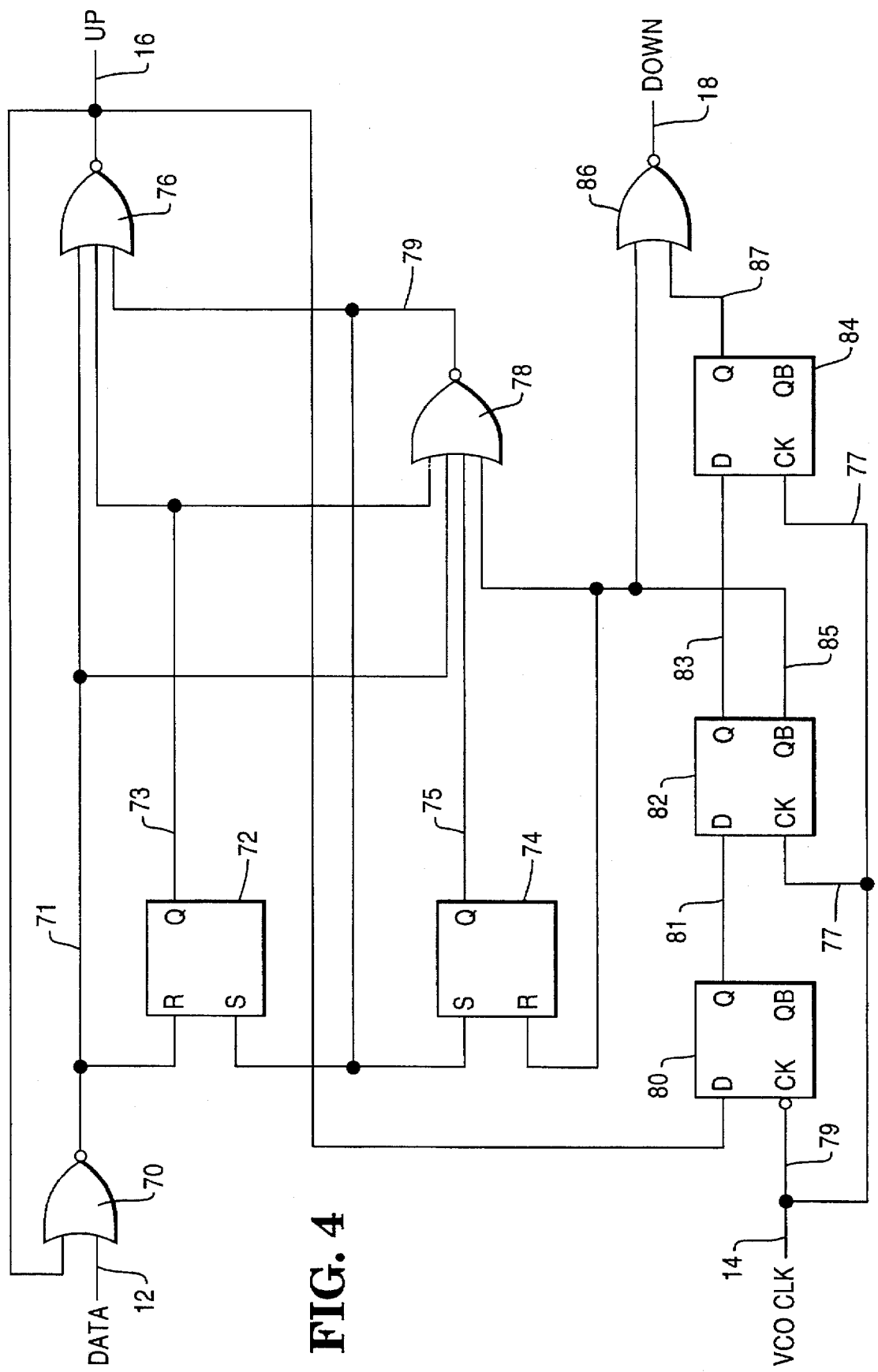
FIG. 4 shows the circuitry for a phase detector using a single-edge of the data and clock signals.
Figure 5:
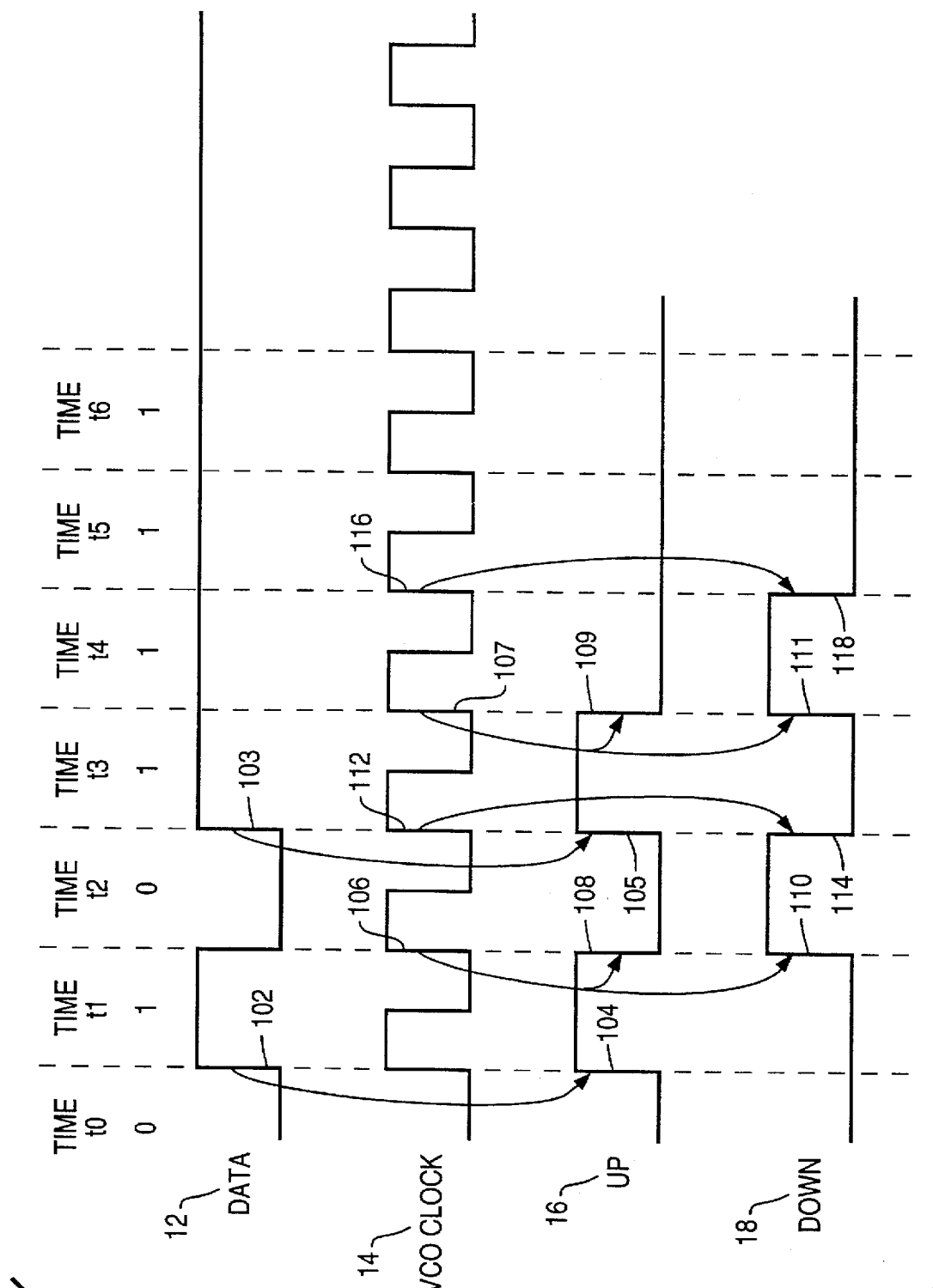
FIG. 5 shows a timing diagram for a single-edge phase detector.

FIG. 4 shows the preferred embodiment of the design where only the rising data and clock edges are used. FIG. 5 shows the wave forms associated with such an implementation. The design could just as easily be implemented using the falling data and clock edges. If the decay time of the loop filter were capable of being precisely monitored and/or controlled, only a single control signal would be needed to increase the charge of the loop filter, since the required decrease in charge would naturally occur due to the known decay time.

It is not important to the invention which type of edge, rising or falling, is used. The important point is that only one type of edge is used. This is in contrast to using both the rising and falling edges of a given signal, as was previously done. A single type/polarity of edge of a signal is hereinafter referred to as a unipolar transition.

Referring specifically to FIG. 4, the data signal 12 is gated to the R input of S-R flip flop 72 through NOR gate 70. Output 71 of NOR gate 70 is also coupled to an input of each NOR gate 76 and 78. The output 73 of flip flop 72 is gated through NOR gate 76 to generate the UP control signal 16. Output 73 of flip flop 72 is also gated through NOR gate 78. Output 79 of NOR gate 78 is coupled to an input of NOR gate 76, and also coupled to the S inputs of S-R flip flops 72 and 74. Output 75 of flip flop 74 is coupled to an input of NOR gate 78. The UP control signal 16 is coupled to an input of NOR gate 70, and to the data input of data latch 80.

Flip flops 72 and 74 are traditional S-R flip flops, having the following logical function. If inputs S and R are both at logical zero, the Q output remains unchanged. If S is high (i.e. a logical one) and R is low (i.e. a logical zero), the output is set and thus Q goes high. If S is low and R is high, the output is reset and thus Q goes low. If S and R are both high, the Q output is undefined. By using the S-R flip flop in conjunction with NOR gates, as will be shown below with respect to the timing diagram of FIG. 5, the UP control signal 16 is only dependent upon a single-edge (i.e. either rising or falling edge, but not both) of the input data signal 12 and VCO clock signal 14.

The VCO clock signal 14 is coupled to the inverted clock input 79 of data latch 80. The VCO clock signal 14 is also coupled to the regular clock inputs 77 of data latches 82 and 84. The Q output 81 of data latch 80 is coupled to the data input of data latch 82. The Q output 83 of data latch 82 is coupled to the data input of data latch 84. The Q output 87 of data latch 84 is coupled to an input of NOR gate 86. The QB inverse output 85 of data latch 82 is coupled to the other input of NOR gate 86.

The QB inverse output 85 is also coupled to an input of NOR gate 78, and to the R input of S-R flip flop 74. This results in modulating the width of the UP control signal based upon the phase difference between the data signal and the clock signal, as will be further described below.

In generating the DOWN signal 18, the VCO clock signal 14 is coupled to each clock input 77 of data latches 82 and 84. Data latches 82 and 84 are serially cascaded to generate a delay, so that when the DOWN signal 18 is activated by QB output signal 85 of data latch 82, the DOWN signal is subsequently deactivated on the next clock by the Q output signal 87 of data latch 84. The active pulse width of the DOWN signal is thus a fixed width, having a duration of one clock period. As will be shown below with respect to the timing diagram of FIG. 5, the DOWN control signal 18 is only dependent upon a single-edge of the VCO clock signal 14.

FIG. 5 shows the resulting timing diagram from the single-edge triggered phase detector of FIG. 4. Initially, at time t0, the data signal 12 and UP signal 16 are inactive. As these are the two inputs to NOR gate 70, output 71 is initially at a logical one. This in turn resets S-R flip flop 72, causing output 73 to be low. A logical one value for output 71 also causes output 79 of NOR gate 78 to be at a logical zero, as any input to NOR gate 78 being a one causes the output to go low. Thus in the initial state, the only input of NOR gate 76 that is active is signal 71.

The rising edge 102 of data signal 12 at time t1 results in UP signal 16 going active at 104 of FIG. 5. Tracing the signals in FIG. 4, the data input 12 to NOR gate 70 goes to a logical one. Output 71 thus changes from a logical one to a logical zero when data 12 goes active. All inputs to NOR gate 76 are then inactive, resulting in the output of NOR gate 76 going active. Thus, the rising edge (102 of FIG. 5) of data input 12 causes the UP control signal 16 to go active at 104 of FIG. 5.

Next, we show what occurs at time t2. Additional reference can be made to the individual signal values at each of times t0-t6, as shown below in Table 1. The falling clock signal during time t1 latched a logical one at output 81, since the data input to latch 80 is the value of the UP control signal 16. This value is latched when the VCO clock signal goes low (during the second half of the clock period), since the inverse clock input of latch 80 is being used. The rising clock signal (106 in FIG. 5) at the beginning of t2 latches the data value 81 at the data input of data latch 82. A logical one at output 81 causes output 83 to go high. Since output 85 is the inverse of output 83, output 85 goes low. As both inputs to NOR gate 86 are low, output 18 goes high. Thus, the rising edge (106 of FIG. 5) of VCO clock 14 at time t2 causes the DOWN control signal 18 to go active at 110 of FIG. 5.

Output 85 going inactive results in all inputs to NOR gate 78 being inactive. As all inputs are at a logical zero, output 79 goes to a logical one. Output 79 activates the S inputs of flip flops 72 and 74, which causes outputs 73 and 75 to be latched at a logical one. This in turn deactivates output 79. Since output 73 is active, the output 16 of NOR gate 76 goes inactive. Thus, in a similar fashion to that described above with respect to the DOWN signal, the rising edge (106 of FIG. 5) of VCO clock 14 causes the UP control signal 16 to deactivate at 108 of FIG. 5.

By having S-R flip flop 72 configured as shown, with the S input being coupled (through NOR gate 78) to the VCO clock signal 14 and the R input being coupled (through NOR gate 70) to the data signal 12, the UP signal is activated by an activated data signal and deactivated by an activated clock signal. Thus, the UP control signal activates at a positive data transition (and thus a variable time with respect to the clock) and deactivates at the next positive clock transition (and thus a fixed time with respect to the clock). This results in modulating the width of the UP control signal based upon the phase difference between the data signal and the clock signal, as will be further described below.

We next show what occurs at time t3. The rising clock signal (112 in FIG. 5) at the beginning of t3 will latch the value 83 at the data input to latch 84. The value latched at output 87 is a logical one, since the output 83 of latch 82 went high during time t2. A logical one at output 87 causes output 18 to go inactive. Thus, the rising edge 112 of VCO clock 14 at time t3 causes the DOWN control signal 18 to go inactive at 114 of FIG. 5.

Continuing with the logical sequencing during time t3, the value latched at output 83 is a logical zero, since the output 81 of latch 80 went low during time t2. Output 85, which is the inverse of output 83, goes to a logical one, and thus resets the output 75 of latch 74 to its initial state of a logical zero.

TABLE 1

|        | t0 | t1 | t2       | t3 | t4       | t5 | t6 |
|--------|----|----|----------|----|----------|----|----|
| sig 12 | 0  | 1  | 0        | 1  | 1        | 1  | 1  |
| sig 71 | 1  | 0  | 1        | 0  | 0        | 0  | 0  |
| sig 73 | 0  | 0  | 1        | 0  | 1        | 1  | 1  |
| sig 75 | 0  | 0  | 1        | 0  | 1        | 0  | 0  |
| sig 79 | 0  | 0  | up pulse | 0  | up pulse | 0  | 0  |
| sig 16 | 0  | 1  | 0        | 1  | 0        | 0  | 0  |
| sig 81 | 1  | 1  | 0        | 1  | 0        | 0  | 0  |
| sig 83 | 0  | 0  | 1        | 0  | 1        | 0  | 0  |
| sig 85 | 1  | 1  | 0        | 1  | 0        | 1  | 1  |
| sig 87 | 0  | 0  | 1        | 0  | 1        | 0  | 0  |

Also during time t3, the data signal 12 goes active at 103 of FIG. 5, causing output 71 to change from a logical one to a logical zero. All inputs to NOR gate 76 are then inactive, resulting in the output of NOR gate 76 going active. Thus, the rising edge 103 of data input 12 causes the UP control signal 16 to go active at 105 of FIG. 5.

The timing sequence at time t4 is similar to that at time t2, and need not be repeated to understand the signals transitions at time t4. The rising edge 107 of VCO clock causes the UP signal to deactivate at 109 and the DOWN signal to activate at 111 of FIG. 5.

The timing sequence at time t5 is similar to that described above with respect to the VCO clock signal during time t3. The rising edge 116 of VCO clock causes the DOWN signal to deactivate at 118 of FIG. 5.

At time t6, nothing happens to the UP and DOWN control signals, since the control signal sequencing is initiated by a changing value of the data signal (which remains at a logical one during time t6).

Since the UP control signal is activated by the rising edge of the data signal 12, and is deactivated by the rising edge of the clock signal 14, the width of the UP pulse is modulated based upon the phase difference between the data and clock signals. The width of the DOWN control signal is fixed. The UP and DOWN control signals are further shown in FIG. 6, which shows examples of the data and clock signals being out of synchronization with one another. By modulating the UP control signal width, the signals are resynchronized, or phase locked, with one another.

Figure 6:
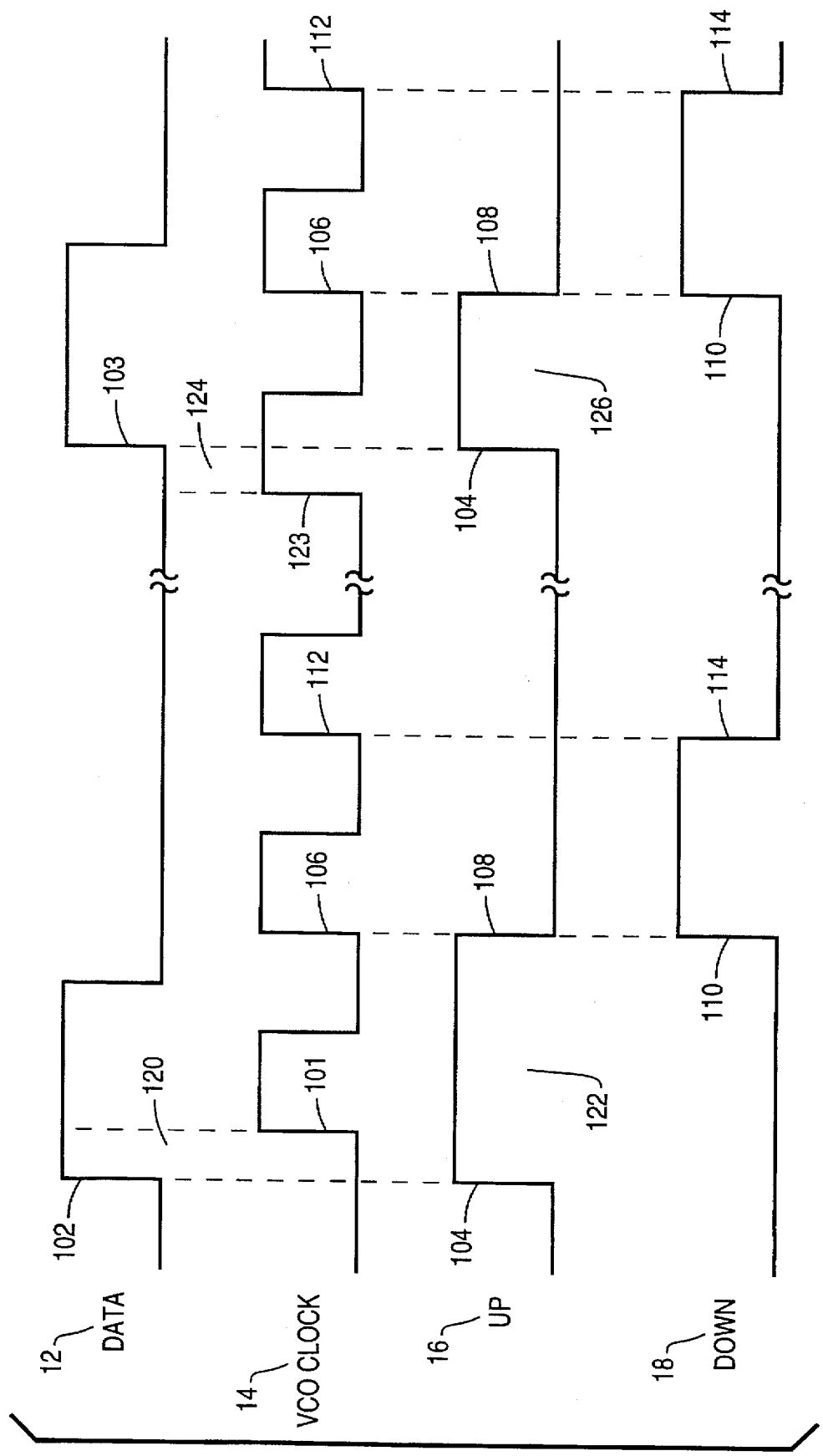
FIG. 6 shows an out of phase clock signal, and resulting control signals.

Referring now to FIG. 6, two examples of out of phase signals are shown. The first example at 120 shows the data signal 12 rising at 102 ahead of the clock signal 14 rising at 101. For this example, the phase of the clock signal 14 needs to be shifted to the left, in order to be phase locked with the data. The resulting UP control signal 16 has a relatively wide pulse width at 122, which results in a voltage increase at the input (26 of FIG. 1) of the VCO (28 of FIG. 1). This increase in voltage will shift the phase of the VCO clock signal to the left, in order to align, or lock, the phase of the clock signal with the phase of the data signal.

The second example at 124 of FIG. 6 shows the data signal 12 rising at 103 after the clock signal 14 rises at 123. For this example, the phase of the clock signal 14 needs to be shifted to the right, in order to be phase locked with the data. The resulting UP control signal 16 has a relatively narrow pulse width at 126, which results in a voltage decrease at the input (26 of FIG. 1) of the VCO (28 of FIG. 1). This decrease in voltage will shift the phase of the VCO clock signal to the right, in order to align, or lock, the phase of the clock signal with the phase of the data signal.

Thus, as can be seen by FIG. 6, the widths of the UP and DOWN control signals are wider than the widths of the UP and DOWN control signals of prior methods shown in FIG. 3. In the preferred embodiment, the DOWN control signal 18 has a fixed width equal to a full clock period. The width of the UP control signal 16 is varied depending upon the relative phase relationship between the data and clock signals. The pulse width of the UP control signal is thus modulated based upon the amount of phase difference between the data and clock signals. When the clock and data signals are phase-locked, and thus no adjustment of the VCO input voltage is required, the width of the UP and DOWN signals are the same. When the input voltage to the VCO needs to be increased, to cause the clock signal to shift to the left in order to phase lock with the data signal, the width of the UP control signal is greater than the width of the DOWN control signal. This causes the charge pump (20 of FIG. 1) to have a greater charge, and increases the voltage at the output of the loop filter (24 of FIG. 1). When the input voltage to the VCO needs to be decreased, to cause the clock signal to shift to the right in order to phase lock with the data signal, the width of the UP control signal is less than the width of the DOWN control signal. This causes the charge pump to have a lesser charge, and decreases the voltage at the output of the loop filter.

As a result of this design, any duty cycle dependence of the VCO clock are eliminated, since only a single polarity (i.e. rising or falling) clock edge is used. Further, the UP and DOWN pulses can be lengthened to one half of a clock period or more.

While we have illustrated and described the preferred embodiments of our invention, it is to be understood that we do not limit ourselves to the precise constructions herein disclosed, and the right is reserved to all changes and modifications coming within the scope of the invention as defined in the appended claims.

We claim:

1. A method for adjusting a clock signal, comprising the steps of:

detecting a unipolar transition on a data signal;

detecting at least one unipolar transition on said clock signal; and adjusting said clock signal, in response to said detected data signal unipolar transition and said at least one detected clock signal unipolar transition, by a plurality of control signals comprising a first signal and a second signal different from the first signal, said first and second signals each having a minimum pulse width of at least one half clock period of the clock signal to phase lock a subsequent transition of the data signal and clock signal coincident with each other.

2. The method of claim 1 wherein said clock signal is generated by a voltage controlled oscillator.

3. The method of claim 1 wherein the step of adjusting said clock signal comprises adjusting phase of said clock signal to phase lock the subsequent transition of the data signal and clock signal coincident with each other.

4. A method for generating a plurality of controls signals used to adjust a clock signal, said plurality of control signals comprising a first signal and a second signal different from the first signal, comprising the steps of:

detecting a unipolar transition on a data signal;

detecting at least one unipolar transition on said clock signal; and generating said first and second control signals, each having a minimum pulse width of at least one half clock period of the clock signal, in response to said detected data signal unipolar transition and said at least one detected clock signal unipolar transition to synchronize a subsequent transition of the data signal and clock signal coincident with each other.

5. The method of claim 4 wherein said plurality of control signals minimizes phase difference between said data signal and clock signal.

6. The method of claim 4 wherein said plurality of control signals synchronize a subsequent transition of the data signal and clock signal coincident with each other.

7. The method of claim 4 wherein said plurality of control signals are used to adjust phase of said clock signal.

8. A method for generating a plurality of control signals in a system having at least one data signal and at least one clock signal, said plurality of control signals comprising a first signal and a second signal different from the first signal, and said data and clock signals comprising a plurality of rising and falling edge transitions, comprising the steps of:

detecting a single edge transition of said data signal;

detecting a first single edge transition of said clock signal;

detecting a second single edge transition, having a same polarity as the first single edge transition, of said clock signal; and generating said first and second control signals, each having a minimum pulse width of at least one half clock period of the clock signal, in response to said detected data signal transition and said detected first and second clock signal transitions, to phase lock a subsequent transition of the data signal and clock signal coincident with each other.

9. The method of claim 8 wherein said plurality of control signals minimizes phase difference between said data signal and clock signal.

10. The method of claim 8 wherein said plurality of control signals synchronize a subsequent transition of the data signal and clock signal coincident with each other.

11. The method of claim 8 wherein said plurality of control signals are used to adjust phase of said clock signal.

12. A method for generating a plurality of control signals by a phase detector, comprising the steps of:

activating a first control signal upon detection of a unipolar transition on a data signal;

activating a second control signal and deactivating said first control signal upon detection by said phase detector of a unipolar transition on said clock signal, said phase detector having an input for directly receiving said clock signal; and deactivating said activated second control signal upon detection by said phase detector of a subsequent unipolar transition on said clock signal.

13. The method of claim 12 wherein said first and second control signals are used to adjust phase of said clock signal.

14. A method for generating a plurality of control signals by a phase detector, comprising the steps of:

latching a first control signal upon detection of an active data signal;

latching a second control signal and resetting said first control signal upon detection by said phase detector of an active clock signal, said phase detector having an input for directly receiving said active clock signal; and resetting said latched second control signal upon detection by said phase detector of a subsequent active clock signal.

15. The method of claim 14 wherein said first and second control signals are used to adjust phase of said clock signal.

16. A phase detector, comprising:

data means for detecting a unipolar transition on a data signal;

clock means for detecting at least one unipolar transition on a clock signal; and means, coupled to said data means and said clock means, for generating a plurality of control signals comprising a first signal and a second signal different from the first signal, the first and second signals each having a minimum pulse width of at least one half clock period of the clock signal to phase lock a subsequent transition of the data signal and clock signal coincident with each other.

17. A phase locked loop circuit, comprising a voltage controlled oscillator and a phase detector, wherein said phase detector further comprises:

data means for detecting a unipolar transition on a data signal;

clock means for detecting at least one unipolar transition on a clock signal; and means, coupled to said data means and said clock means, for generating a plurality of control signals comprising a first signal and a second signal different from the first signal, the first and second signals each having a minimum pulse width of at least one half clock period of the clock signal, to synchronize a subsequent transition of the data signal and clock signal coincident with each other.

18. The circuit of claim 17 wherein said clock signal is generated by said voltage controlled oscillator.

19. The circuit of claim 18 further comprising a charge pump, wherein said plurality of control signals are coupled to the charge pump.

20. A phase locked loop circuit, comprising a phase detector, wherein said phase detector further comprises:
   data means for detecting a unipolar transition on a data signal;
   clock means for detecting at least one unipolar transition on a clock signal;
   means, coupled to said data means and said clock means, for generating a plurality of control signals comprising a first signal and a second signal different from the first signal, the first and second signals each having a minimum pulse width of at least one half clock period of the clock signal; and
   means, coupled to said plurality of control signals, for adjusting phase of said clock signal to coincide a subsequent data signal unipolar transition and clock signal unipolar transition.

21. The circuit of claim 20 wherein said clock signal is generated by a voltage controlled oscillator.

22. The circuit of claim 21 further comprising a charge pump, wherein said plurality of control signals are coupled to said charge pump.

23. A system for generating a plurality of control signals, comprising a phase detector circuit having an input for directly receiving a clock signal, said phase detector circuit comprising:
   means for activating a first control signal upon detection of a unipolar transition on a data signal;
   means for activating a second control signal, and deactivating said first control signal, upon detection by said phase detector of a unipolar transition on said clock signal; and
   means for deactivating said activated second control signal upon detection by said phase detector of a subsequent unipolar transition on said clock signal.

24. The system of claim 23 wherein said clock signal is generated by a voltage controlled oscillator.

25. The system of claim 24 wherein said plurality of control signals are coupled to said voltage controlled oscillator.

26. The system of claim 23 further comprising means, coupled to said first and second control signals, for adjusting phase of said clock signal.

27. A phase detector circuit for generating a plurality of control signals, said phase detector circuit having an input for directly receiving a clock signal, comprising:
   means for latching a first control signal upon detection of an active signal level of a data signal;
   means for latching a second control signal and resetting said first control signal upon detection by said phase detector circuit of an active signal level of said clock signal; and
   means for resetting said latched second control signal upon detection by said phase detector circuit of a subsequent active clock signal.

28. The circuit of claim 27 wherein said clock signal is generated by a voltage controlled oscillator.

29. The circuit of claim 28 wherein said plurality of control signals are coupled to said voltage controlled oscillator.

30. The system of claim 27 further comprising means, coupled to said first and second control signals, for adjusting phase of said clock signal.

31. A method for using the phase detector of claim 16, comprising the step of using said plurality of control signals to adjust phase of said clock signal.

32. A method for using the phase lock loop circuit of claim 17, comprising the step of using said plurality of control signals to adjust phase of said clock signal.

33. A phase detector, comprising:
   a unipolar data signal transition detector circuit;
   a unipolar clock signal transition detector circuit for detecting a unipolar transition of said clock signal;
   a control signal generation circuit coupled to said unipolar data signal transition detector circuit and said unipolar clock signal transition detector circuit for generating a plurality of control signals comprising a first signal and a second signal different from the first signal, the first and second signals each having a minimum pulse width of at least one half clock period of said clock signal; and
   means for synchronizing a subsequent data signal transition and subsequent clock signal transition coincident with each other.

34. A phase locked loop circuit, comprising a voltage controlled oscillator and a phase detector, wherein said phase detector further comprises:
   a unipolar data signal transition detector circuit;
   a unipolar clock signal transition detector circuit for detecting a unipolar transition of said clock signal;
   a control signal generation circuit coupled to said unipolar data signal transition detector circuit and said unipolar clock signal transition detector circuit for generating a plurality of control signals comprising a first signal and a second signal different from the first signal, the first and second signals each having a minimum pulse width of at least one half clock period of said clock signal; and
   means for synchronizing at least one subsequent data and clock signal coincident with each other.

35. A method for adjusting a clock signal, comprising the steps of:
   detecting a unipolar transition on a data signal comprising a plurality of transitioning data values and a plurality of consecutive same value data values;
   detecting at least one unipolar transition on said clock signal; and
   adjusting said clock signal in response to said detected data signal unipolar transition and said detected clock signal unipolar transition by generating a first control signal having a fixed pulse width equal to a clock period of said clock signal and a second control signal having pulse width dependent upon the relative phase relationship between the data signal and clock signal, to synchronize a subsequent transition of the data signal and clock signal coincident with each other.

36. A phase detector, comprising:
   data means for detecting a unipolar transition on a data signal comprising a plurality of transitioning data values and a plurality of consecutive same value data values;
   clock means for detecting a unipolar transition on said clock signal; and
   means, coupled to said data means and said clock means, for adjusting said clock signal by generating a first control signal having a fixed pulse width equal to a clock period of said clock signal and a second control signal having pulse width dependent upon the relative phase relationship between the data signal and clock signal, to synchronize a subsequent transition of the data signal and clock signal coincident with each other.

* * * * *